(12) United States Patent
Ye et al.

(10) Patent No.: US 7,588,668 B2
(45) Date of Patent: Sep. 15, 2009

(54) THERMALLY CONDUCTIVE DIELECTRIC BONDING OF SPUTTERING TARGETS USING DIAMOND POWDER FILLER OR THERMALLY CONDUCTIVE CERAMIC FILLERS

(75) Inventors: Yan Ye, Saratoga, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 128 days.

(21) Appl. No.: 11/368,000

(22) Filed: Mar. 3, 2006

(65) Prior Publication Data

US 2007/0205101 A1 Sep. 6, 2007

Related U.S. Application Data

(63) Continuation-in-part of application No. 11/225,922, filed on Sep. 13, 2005, now abandoned, and a continuation-in-part of application No. 11/225,923, filed on Sep. 13, 2005.

(60) Provisional application No. 60/733,939, filed on Nov. 4, 2005.

(51) Int. Cl.
*C23C 14/34* (2006.01)

(52) U.S. Cl. ............................ 204/298.12; 204/298.13; 204/298.07; 204/298.09; 156/283; 156/284; 156/298; 156/314; 156/324.4; 156/329; 156/330

(58) Field of Classification Search ............ 204/298.07, 204/298.09, 298.12, 298.13; 156/283, 284, 156/298, 314, 324.4, 329, 330
See application file for complete search history.

(56) References Cited

U.S. PATENT DOCUMENTS

| 3,878,085 | A | 4/1975 | Corbani |
| 4,272,355 | A | 6/1981 | Kennedy |
| 4,275,126 | A | 6/1981 | Bergmann et al. |
| 4,415,427 | A | 11/1983 | Hidler et al. |
| 4,437,966 | A | 3/1984 | Hope et al. |
| 4,444,643 | A | 4/1984 | Garrett |

(Continued)

FOREIGN PATENT DOCUMENTS

DE 4127 260 C1 * 4/1992

(Continued)

OTHER PUBLICATIONS

Machine Translation of DE 41 27 260 C1 dated Apr. 1992.*

(Continued)

*Primary Examiner*—Rodney G McDonald
(74) *Attorney, Agent, or Firm*—Patterson & Sheridan, LLP

(57) ABSTRACT

A sputtering target assembly and method for bonding a sputtering target to a backing plate is disclosed. When insulatively bonding a sputtering target to a backing plate, it is necessary to ensure that the bonding material has good thermal conductivity so that the temperature of the target can be effectively controlled. It is also important to not have electrical conductivity through the bonding materials. In order to achieve both goals, it is beneficial to utilize an elastomer with diamond powder filler. Diamond power has very good thermal conductivity, and it also has very good dielectric strength. Diamond is a thermally effective and cost effective substitute for silver in insulative bonding.

20 Claims, 8 Drawing Sheets

U.S. PATENT DOCUMENTS

| | | | |
|---|---|---|---|
| 4,600,492 A | 7/1986 | Ooshio et al. | |
| 4,610,775 A | 9/1986 | Phifer | |
| 4,631,106 A | 12/1986 | Nakazato et al. | |
| 4,714,536 A | 12/1987 | Freeman et al. | |
| 4,717,462 A | 1/1988 | Homma et al. | |
| 4,724,060 A | 2/1988 | Sakata et al. | |
| 4,824,544 A | 4/1989 | Mikalesen et al. | |
| 4,826,584 A | 5/1989 | dos Santos Pereiro Ribeiro et al. | |
| 5,202,008 A | 4/1993 | Talieh et al. | |
| 5,223,108 A | 6/1993 | Hurwitt | |
| 5,230,459 A | 7/1993 | Mueller et al. | |
| 5,242,566 A | 9/1993 | Parker | |
| 5,252,194 A | 10/1993 | Demaray et al. | |
| 5,282,943 A | 2/1994 | Lannutti et al. | |
| 5,314,597 A | 5/1994 | Harra | |
| 5,320,728 A | 6/1994 | Tepman | |
| 5,328,585 A | 7/1994 | Stevenson et al. | |
| 5,334,302 A | 8/1994 | Kubo et al. | |
| 5,362,372 A | 11/1994 | Tepman | |
| 5,374,343 A | 12/1994 | Sasaki et al. | |
| 5,380,414 A | 1/1995 | Tepman | |
| 5,382,344 A | 1/1995 | Hosokawa et al. | |
| 5,403,459 A | 4/1995 | Guo | |
| 5,419,029 A | 5/1995 | Raaijmakers | |
| 5,439,524 A | 8/1995 | Cain et al. | |
| 5,458,759 A | 10/1995 | Hosokawa et al. | |
| 5,505,833 A | 4/1996 | Werner et al. | |
| 5,549,802 A | 8/1996 | Guo | |
| 5,565,071 A | 10/1996 | Demaray et al. | |
| 5,593,082 A | 1/1997 | Ivanov et al. | |
| 5,598,622 A | 2/1997 | Raaijmakers | |
| 5,614,055 A | 3/1997 | Fairbairn et al. | |
| 5,628,869 A | 5/1997 | Mallon | |
| 5,630,917 A | 5/1997 | Guo | |
| 5,653,856 A | 8/1997 | Ivanov et al. | |
| 5,658,442 A | 8/1997 | Van Gogh et al. | |
| 5,693,203 A | 12/1997 | Ohhashi et al. | |
| 5,707,498 A | 1/1998 | Ngan | |
| 5,725,740 A | 3/1998 | Raaijmakers | |
| 5,755,936 A | 5/1998 | Raaijmakers | |
| 5,780,357 A | 7/1998 | Xu et al. | |
| 5,798,029 A | 8/1998 | Morita | |
| 5,819,434 A | 10/1998 | Herchen et al. | |
| 5,824,197 A | 10/1998 | Tanaka et al. | |
| 5,827,408 A | 10/1998 | Raaijmakers | |
| 5,833,815 A | 11/1998 | Kim et al. | |
| 5,855,744 A | 1/1999 | Halsey et al. | |
| 5,873,989 A | 2/1999 | Hughes et al. | |
| 5,876,573 A * | 3/1999 | Moslehi et al. | 204/192.12 |
| 5,876,574 A | 3/1999 | Hofmann et al. | |
| 5,876,838 A | 3/1999 | Mallon | |
| 5,914,018 A | 6/1999 | Fu et al. | |
| 5,942,042 A | 8/1999 | Gogh | |
| 5,956,608 A | 9/1999 | Khurana et al. | |
| 5,990,016 A | 11/1999 | Kim et al. | |
| 6,071,389 A | 6/2000 | Zhang | |
| 6,083,360 A | 7/2000 | Ohlhausen et al. | |
| 6,093,293 A * | 7/2000 | Haag et al. | 204/298.12 |
| 6,103,069 A | 8/2000 | Davenport | |
| 6,113,700 A | 9/2000 | Choi et al. | |
| 6,143,140 A | 11/2000 | Wang et al. | |
| 6,143,149 A | 11/2000 | Abe et al. | |
| 6,168,696 B1 | 1/2001 | Burton et al. | |
| 6,176,978 B1 | 1/2001 | Ngan | |
| 6,182,603 B1 | 2/2001 | Shang et al. | |
| 6,183,614 B1 | 2/2001 | Fu | |
| 6,199,259 B1 | 3/2001 | Demaray et al. | |
| 6,200,431 B1 | 3/2001 | Sone et al. | |
| 6,217,715 B1 | 4/2001 | Sun et al. | |
| 6,228,438 B1 | 5/2001 | Schmitt et al. | |
| 6,248,398 B1 | 6/2001 | Talieh et al. | |
| 6,251,242 B1 | 6/2001 | Fu et al. | |
| 6,271,592 B1 | 8/2001 | Kim et al. | |
| 6,274,015 B1 | 8/2001 | Beier et al. | |
| 6,281,469 B1 | 8/2001 | Perrin et al. | |
| 6,284,106 B1 | 9/2001 | Haag et al. | |
| 6,287,436 B1 | 9/2001 | Pelletier et al. | |
| 6,287,437 B1 | 9/2001 | Pandhumsoporn et al. | |
| 6,302,960 B1 | 10/2001 | Baroudi et al. | |
| 6,322,679 B1 | 11/2001 | De Bosscher et al. | |
| 6,344,420 B1 | 2/2002 | Miyajima et al. | |
| 6,376,385 B2 * | 4/2002 | Lilleland et al. | 438/710 |
| 6,383,573 B1 | 5/2002 | Beck et al. | |
| 6,395,146 B2 | 5/2002 | Hieronymi et al. | |
| 6,413,383 B1 | 7/2002 | Chiang et al. | |
| 6,413,384 B1 | 7/2002 | Wu et al. | |
| 6,416,639 B1 | 7/2002 | De Bosscher et al. | |
| 6,419,806 B1 | 7/2002 | Holcomb et al. | |
| 6,432,819 B1 | 8/2002 | Pavate et al. | |
| 6,436,251 B2 | 8/2002 | Gopalraja et al. | |
| 6,444,104 B2 | 9/2002 | Gopalraja et al. | |
| 6,451,184 B1 | 9/2002 | Sone et al. | |
| 6,451,185 B2 | 9/2002 | Beier et al. | |
| 6,454,855 B1 | 9/2002 | Von Kanel et al. | |
| 6,488,822 B1 | 12/2002 | Moslehi | |
| 6,502,530 B1 | 1/2003 | Turlot et al. | |
| 6,521,108 B1 | 2/2003 | Zhang | |
| 6,556,536 B1 | 4/2003 | Reynolds et al. | |
| 6,579,431 B1 | 6/2003 | Bolcavage et al. | |
| 6,589,407 B1 | 7/2003 | Subramani et al. | |
| 6,619,131 B2 | 9/2003 | Walchli et al. | |
| 6,619,537 B1 | 9/2003 | Zhang et al. | |
| 6,631,692 B1 | 10/2003 | Matsuki et al. | |
| 6,692,619 B1 | 2/2004 | Chen et al. | |
| 6,699,375 B1 | 3/2004 | Crocker | |
| 6,709,557 B1 | 3/2004 | Kailasam et al. | |
| 6,723,210 B2 | 4/2004 | Teng et al. | |
| 6,725,522 B1 | 4/2004 | Ivanov et al. | |
| 6,740,367 B2 | 5/2004 | Matsuki et al. | |
| 6,749,103 B1 | 6/2004 | Ivanov et al. | |
| 6,780,794 B2 | 8/2004 | Parfeniuk et al. | |
| 6,793,124 B1 | 9/2004 | Takahashi et al. | |
| 6,793,733 B2 | 9/2004 | Janakiraman et al. | |
| 6,802,949 B2 | 10/2004 | Hong et al. | |
| 6,806,651 B1 | 10/2004 | Chistyakov | |
| 6,808,611 B2 | 10/2004 | Sun et al. | |
| 6,814,838 B2 | 11/2004 | Weichart et al. | |
| 6,840,427 B2 | 1/2005 | Ivanov | |
| 6,848,608 B2 | 2/2005 | Wickersham, Jr. | |
| 6,852,168 B2 | 2/2005 | Park et al. | |
| 6,873,764 B2 | 3/2005 | Maisenholder et al. | |
| 6,878,242 B2 | 4/2005 | Wang et al. | |
| 6,916,407 B2 | 7/2005 | Voser et al. | |
| 6,918,352 B2 | 7/2005 | Von Kanel et al. | |
| 6,961,490 B2 | 11/2005 | Maisenhoelder et al. | |
| 2001/0023742 A1 | 9/2001 | Schmitt | |
| 2001/0045352 A1 | 11/2001 | Robinson et al. | |
| 2002/0011215 A1 | 1/2002 | Tei et al. | |
| 2003/0089314 A1 | 5/2003 | Matsuki et al. | |
| 2003/0234175 A1 | 12/2003 | Teng | |
| 2004/0020769 A1 * | 2/2004 | Ivannov et al. | 204/298.12 |
| 2004/0129211 A1 | 7/2004 | Blonigan et al. | |
| 2004/0231973 A1 | 11/2004 | Sato et al. | |
| 2005/0006222 A1 | 1/2005 | Ding et al. | |
| 2005/0066898 A1 | 3/2005 | Schmitt et al. | |
| 2005/0103620 A1 | 5/2005 | Chistyakov | |

FOREIGN PATENT DOCUMENTS

| | | | |
|---|---|---|---|
| JP | 62-76145 | * | 4/1987 |
| JP | 03-111564 | * | 5/1991 |
| JP | 11-200027 | * | 7/1999 |

OTHER PUBLICATIONS

PCT International Search Report and the Written Opinion dated Nov. 2, 2007 for International Application No. PCT/US 06/60069.

PCT International Search Report and the Written Opinion dated Dec. 5, 2007 for International Application No. PCT/US 06/31989.

PCT International Search Report and Written opinion dated Dec. 14, 2006 for PCT/US06/32219.

PCT International Preliminary Report on Patentability dated Mar. 18, 2008 for PCT/US06/32219.

* cited by examiner

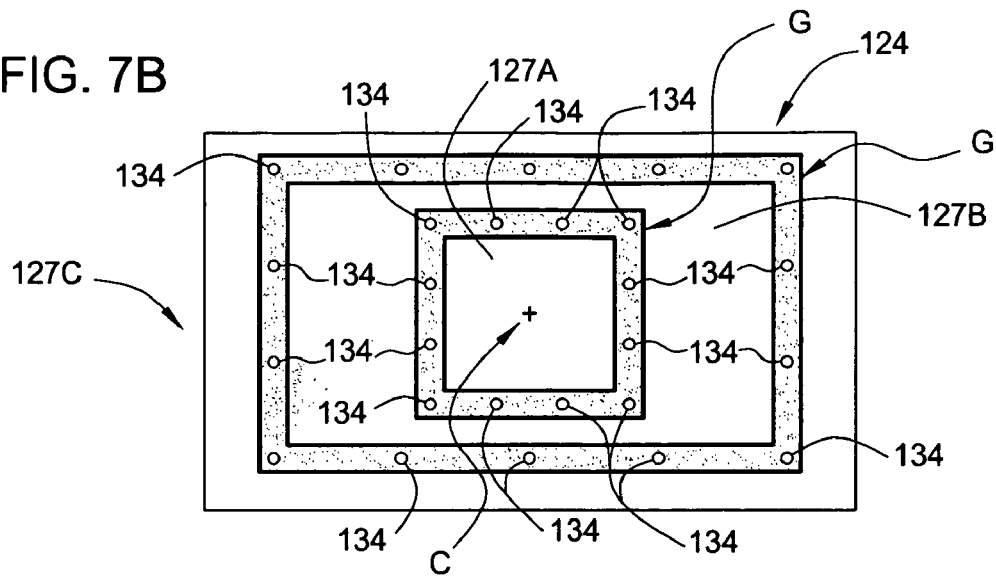
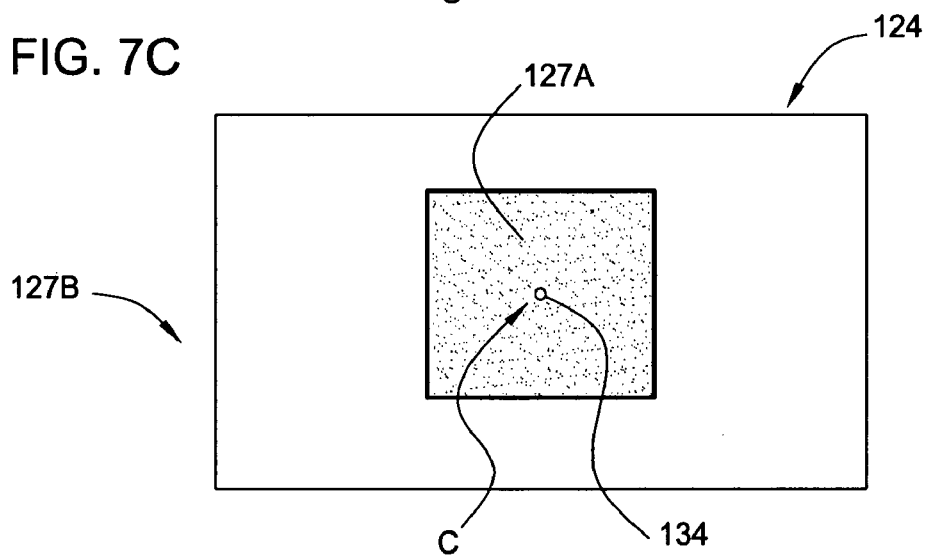
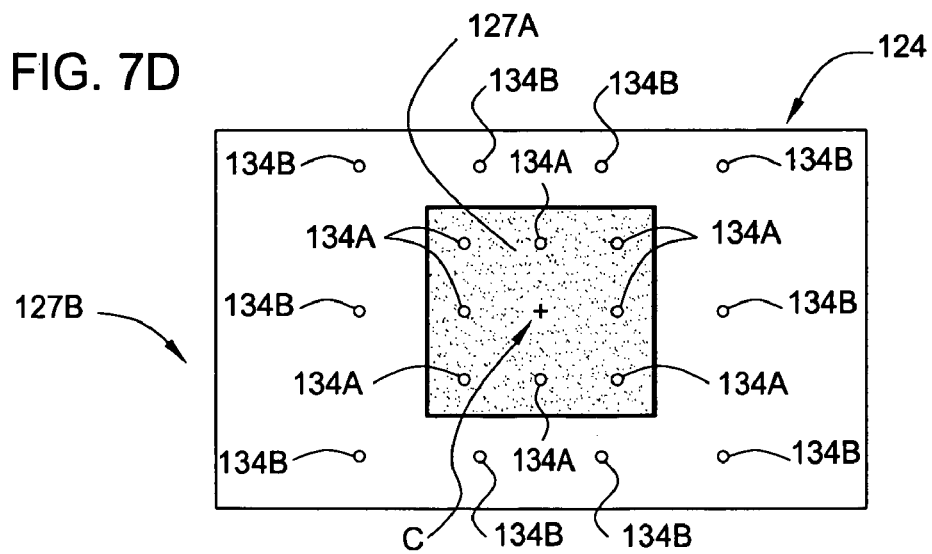

THERMALLY CONDUCTIVE DIELECTRIC BONDING OF SPUTTERING TARGETS USING DIAMOND POWDER FILLER OR THERMALLY CONDUCTIVE CERAMIC FILLERS

CROSS-REFERENCE TO RELATED APPLICATIONS

This application is a continuation-in-part of U.S. patent application Ser. No. 11/225,922, filed Sep. 13, 2005 now abandoned. This application is also a continuation-in-part of U.S. patent application Ser. No. 11/225,923, filed Sep. 13, 2005. This application claims the benefit of U.S. Provisional Application Ser. No. 60/733,939 filed Nov. 4, 2005. Each of the aforementioned related patent applications is herein incorporated by reference.

BACKGROUND OF THE INVENTION

1. Field of the Invention

Embodiments of the present invention generally relate to a sputtering target assembly and a method of bonding a sputtering target to a backing plate.

2. Description of the Related Art

In sputtering large area substrates (i.e. flat panel displays, solar cells, etc.), some problems are encountered including non-uniform deposition and low target utilization. Therefore, there is a need for an improved sputtering apparatus and method.

SUMMARY OF THE INVENTION

The present invention generally provides a sputtering target bonded to a backing plate. To bond the sputtering target to the backing plate, the inventors propose using a bonding material that comprises diamond or ceramic or a combination thereof.

In a first embodiment, a sputtering target assembly is disclosed. The sputtering target assembly has a sputtering target, a backing plate, and material bonding the target to the backing plate. The bonding material has diamond in it.

In a second embodiment, a method of bonding a target to a backing plate is disclosed. The method involves providing a sputtering target, providing a backing plate, providing a bonding material between the target and the backing plate, and pressing the target, the backing plate, and the bonding material together and thermally curing. The bonding material has diamond in it.

In a third embodiment, a sputtering target assembly is disclosed. The target assembly has a sputtering target, a backing plate, and material bonding the target to the backing plate. The material bonding the target to the backing plate has a ceramic material with a thermal conductivity of greater than 0.1 W/cmK. The material bonding the target to the backing plate does not have silver in it.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7B illustrates a plan view of one embodiment of the multizone target assembly and process gas delivery assembly, which may be useful to perform aspects of the invention disclosed herein.

FIG. 7C illustrates a plan view of one embodiment of the multizone target assembly and process gas delivery assembly, which may be useful to perform aspects of the invention disclosed herein.

FIG. 7D illustrates a plan view of one embodiment of the multizone target assembly and process gas delivery assembly, which may be useful to perform aspects of the invention disclosed herein.

DETAILED DESCRIPTION

The present invention involves insulatively boding sputtering targets to backing plates while maintaining a good thermal conductivity. Having a good thermal conductivity is necessary in insulatively bonding a target to a backing plate so that the temperature of the sputtering target can be controlled.

Target Assembly Hardware

Figure 2:
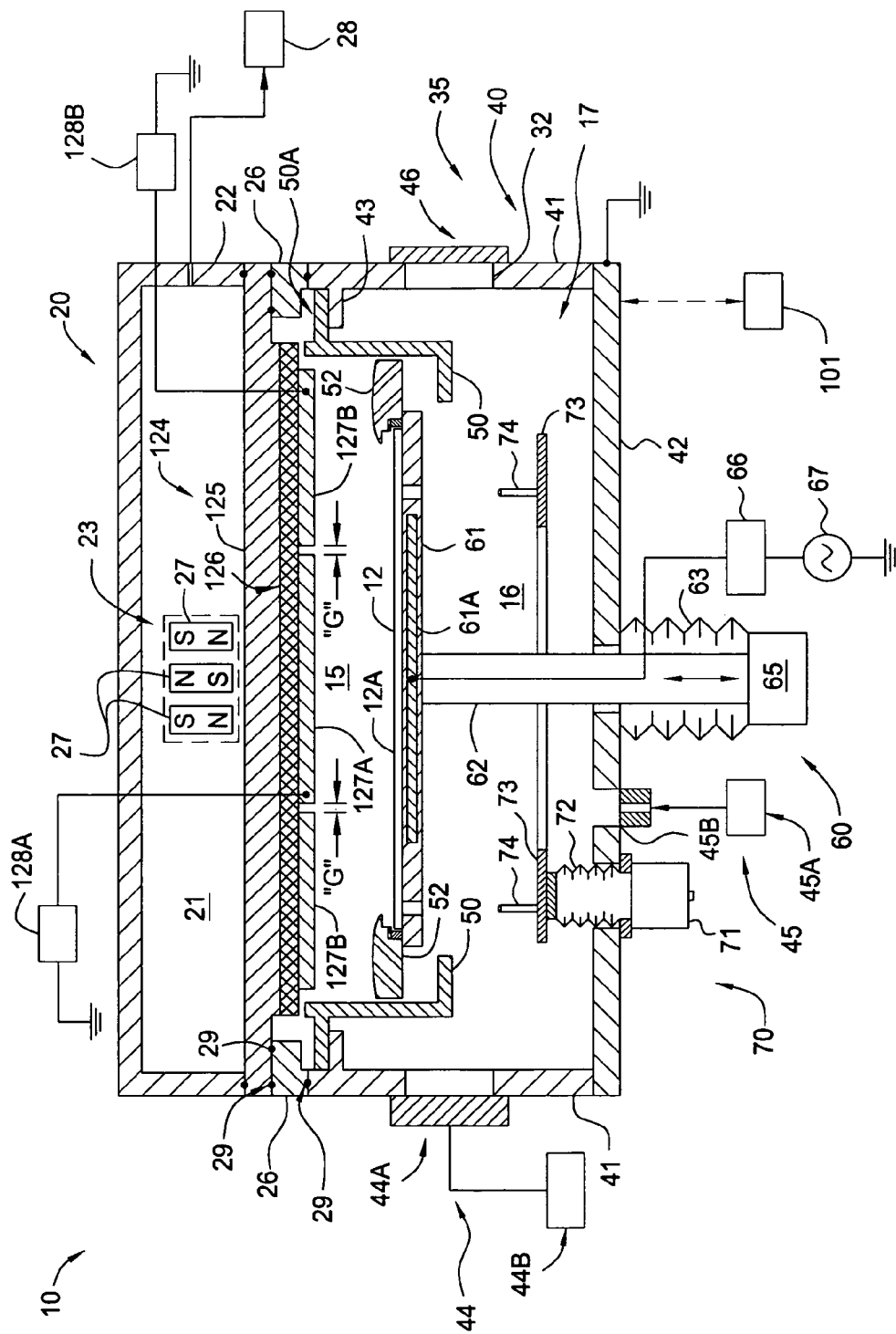
FIG. 2 is a vertical cross-sectional view of an exemplary physical vapor deposition chamber.

FIG. 2 illustrates a vertical cross-sectional view of one embodiment of a processing chamber 10 that may be used to perform aspects of the invention described herein. In general, the various embodiments described herein utilize a multizone target assembly 124 that is used to generate a plasma of varying density in the processing region 15 of the processing chamber 10 by separately biasing different target sections 127A, 127B to achieve a desired sputter deposition profile across the substrate surface. Referring to FIG. 2, the processing region 15 is generally the region formed between the multizone target assembly 124, a surface of a substrate 12 positioned on the substrate support 61, and the shield 50. The term sputter deposition profile is intended to describe the deposited film thickness as measured across the substrate processing surface (element 12A). In one aspect, the sputter deposition profile is adjusted by tailoring the plasma density profile throughout the processing region 15, by varying the voltage applied to the target sections. FIG. 2 illustrates one embodiment of the multizone target 124 that contains two target sections (e.g., elements 127A and 127B). FIG. 2 also illustrates a substrate 12 that is positioned in a processing position in the processing region 15.

In one aspect, the target sections 127A, 127B are generally made from the same or similar materials, which are to be sputter deposited on the processing surface 12A of the substrate 12. Typical elements or materials that the target sections may contain include, but are not limited to molybdenum, aluminum, aluminum neodymium alloys, copper, titanium, tantalum, tungsten, chromium, indium tin oxide, zinc, or zinc oxide. Thus, in one aspect, the target sections are made from metals that are doped, or alloyed, with a number of different components, such as a zinc material that is doped the elements aluminum (Al), silicon (Si), and/or gallium (Ga), or a copper material that is doped the elements indium (In), gallium (Ga), and/or selenium (Se).

In general, the processing chamber 10 contains a lid assembly 20 and a lower chamber assembly 35. The lower chamber assembly 35 generally contains a substrate support assembly 60, chamber body assembly 40, a shield 50, a process gas delivery system 45 and a shadow frame 52. The shadow frame 52 is used to shadow the edge of the substrate to prevent or minimize the amount of deposition on the edge of a substrate 12 and substrate support 61 during processing (see FIG. 2). The chamber body assembly 40 contains one or more chamber walls 41 and a chamber base 42. The one or more chamber walls 41, the chamber base 42 and a surface of the multizone target assembly 124 form a vacuum processing area 17 that has a lower vacuum region 16 and a processing region 15. In one aspect, a shield mounting surface 50A of the shield 50 is mounted on or connected to a grounded chamber shield support 43 formed in the chamber walls 41 to ground the shield 50. In one aspect, the process chamber 10 contains a process gas delivery system 45 that has one or more gas sources 45A that are in fluid communication with one or more inlet ports 45B that are used to deliver a process gas to the vacuum processing area 17. In one aspect, discussed below in conjunction with FIG. 7A, the process gas could be delivered to the processing region 15 through the multizone target assembly 124. Process gases that may be used in PVD type applications are, for example, inert gases such as argon or other reactive type gases such as nitrogen or oxygen containing gas sources. In one embodiment, the substrate support 61 may contain RF biasable elements 61A embedded within the substrate support 61 that can be used to capacitively RF couple the substrate support 61 to the plasma generated in the processing region 15 by use of an RF power source 67 and RF matching device 66. The ability to RF bias the substrate support 61 may be useful to help improve the plasma density, improve the deposition profile on the substrate, and increase the energy of the deposited material at the surface of the substrate.

The substrate support assembly 60 generally contains a substrate support 61, a shaft 62 that is adapted to support the substrate support 61, and a bellows 63 that is sealably connected to the shaft 62 and the chamber base 42 to form a moveable vacuum seal that allows the substrate support 61 to be positioned in the lower chamber assembly 35 by the lift mechanism 65. The lift mechanism 65 may contain a conventional linear slide (not shown), pneumatic air cylinder (not shown) and/or DC servo motor that is attached to a lead screw (not shown), which are adapted to position the substrate support 61, and substrate 12, in a desired position in the processing region 15.

Referring to FIG. 2, the lower chamber assembly 35 will also generally contain a substrate lift assembly 70, slit valve 46, and vacuum pumping system 44. The lift assembly 70 contains three or more lift pins 74, a lift plate 73, a lift actuator 71, and a bellows 72 that is sealably connected to the lift actuator 71 and the chamber base 42 so that the lift pins 74 can remove and replace a substrate positioned on a robot blade (not shown) that has been extended into the lower chamber assembly 35 from a central transfer chamber (not shown). The extended robot blade enters the lower chamber assembly 35 through the access port 32 in the chamber wall 41 and is positioned above the substrate support 61 that is positioned in a transfer position (not shown). The vacuum pumping system 44 (elements 44A and 44B) may generally contain a cryopump, turbo pump, cryo-turbo pump, rough pump, and/or roots blower to evacuate the lower vacuum region 16 and processing region 15 to a desired base and/or processing pressure. A slit valve actuator (not shown) which is adapted to position the slit valve 46 against or away from the one or more chamber walls 41 may be a conventional pneumatic actuator which are well known in the art.

To control the various processing chamber 10 components, power supplies 128A & B, gas supplies, and process variables during a deposition process, a controller 101 is used. The controller 101 is typically a microprocessor-based controller. The controller 101 is configured to receive inputs from a user and/or various sensors in the plasma processing chamber and appropriately control the plasma processing chamber components in accordance with the various inputs and software instructions retained in the controller's memory. The controller 101 generally contains memory and a CPU which are utilized by the controller to retain various programs, process the programs, and execute the programs when necessary. The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits; input/output circuitry, subsystems, and the like all well known in the art. A program (or computer instructions) readable by the controller 101 determines which tasks are performable in the plasma processing chamber. Preferably, the program is software readable by the controller 101 and includes instructions to monitor and control the plasma process based on defined rules and input data.

The lid assembly 20 contains a multizone target assembly 124, a lid enclosure 22, a ceramic insulator 26, one or more o-ring seals 29 and one or more magnetron assemblies 23 that are positioned in a target backside region 21. In one aspect, the ceramic insulator 26 is not required to provide electrical isolation between the backing plate 125 of the multizone target assembly 124 and the chamber body assembly 40. Generally, each magnetron assembly 23 will have at least one magnet 27 that has a pair of opposing magnetic poles (i.e., north (N) and south (S)) that create a magnetic field (B-field) that passes through the multizone target assembly 124 and the processing region 15 (see element "B" in FIG. 4). FIG. 2 illustrates a vertical cross-section of one embodiment of a processing chamber 10 that has one magnetron assembly 23 that contains three magnets 27, which are positioned in the target backside region 21 at the back of the multizone target assembly 124. An exemplary magnetron assembly, that may be adapted to benefit the invention described herein, is further described in the commonly assigned U.S. patent application Ser. No. 10/863,152, filed Jun. 7, 2004, which claims the benefit of U.S. Provisional Patent Application Ser. No. 60/534,952, filed Jan. 7, 2004, and is hereby incorporated by reference in its entirety to the extent not inconsistent with the claimed invention.

To perform a PVD deposition process, the controller 101 commands the vacuum pumping system 44 to evacuate the processing chamber 10 to a predetermined pressure/vacuum so that the plasma processing chamber 10 can receive a substrate 12 from a system robot (not shown) mounted to a central transfer chamber (not shown) which is also under vacuum. To transfer a substrate 12 to the processing chamber 10, the slit valve 46, which seals off the processing chamber 10 from the central transfer chamber, opens to allow the system robot to extend through the access port 32 in the chamber wall 41. The lift pins 74 then remove the substrate 12 from the extended system robot, by lifting the substrate from the extended robot blade (not shown). The system robot then retracts from the processing chamber 10 and the slit valve 46 closes to isolate the processing chamber 10 from the central transfer chamber. The substrate support 61 then lifts the substrate 12 from the lift pins 74 and moves the substrate 12 to a desired processing position below the multizone target assembly 124.

After achieving a desired base pressure, a desired flow of a processing gas is injected into the processing region 15 and a bias voltage is applied to at least one of the target sections 127A, 127B of the multizone target assembly 124 by use of a power supply 128A-B attached to the target section that is to be biased. The application of a bias voltage by the power supply causes ionization and dissociation of the gas in the processing region 15 and the generated ions subsequently bombard the surface of the cathodically biased target section(s) and thus "sputter" the target atoms from the target surface.

A percentage of the "sputtered" target atoms land on the surface of the substrate positioned on the surface of the substrate support 61. The ion energy and ion flux near the target sections, which is related to the magnitude of the bias voltage applied to each of the biased target sections, can thus be tailored to assure a uniform or desired distribution is achieved throughout the processing region. Each target section that is not biased can either be electrically floating or be grounded. In either case, generally no sputtering activity will occur on these target sections during this process step. The term "grounded" as used herein is generally intended to describe a direct or in direct electrical connection between a component that is to be "grounded" and the anode surfaces (e.g., element 50) positioned inside the processing chamber 10.

Magnetron Design for Processing

Figure 3:
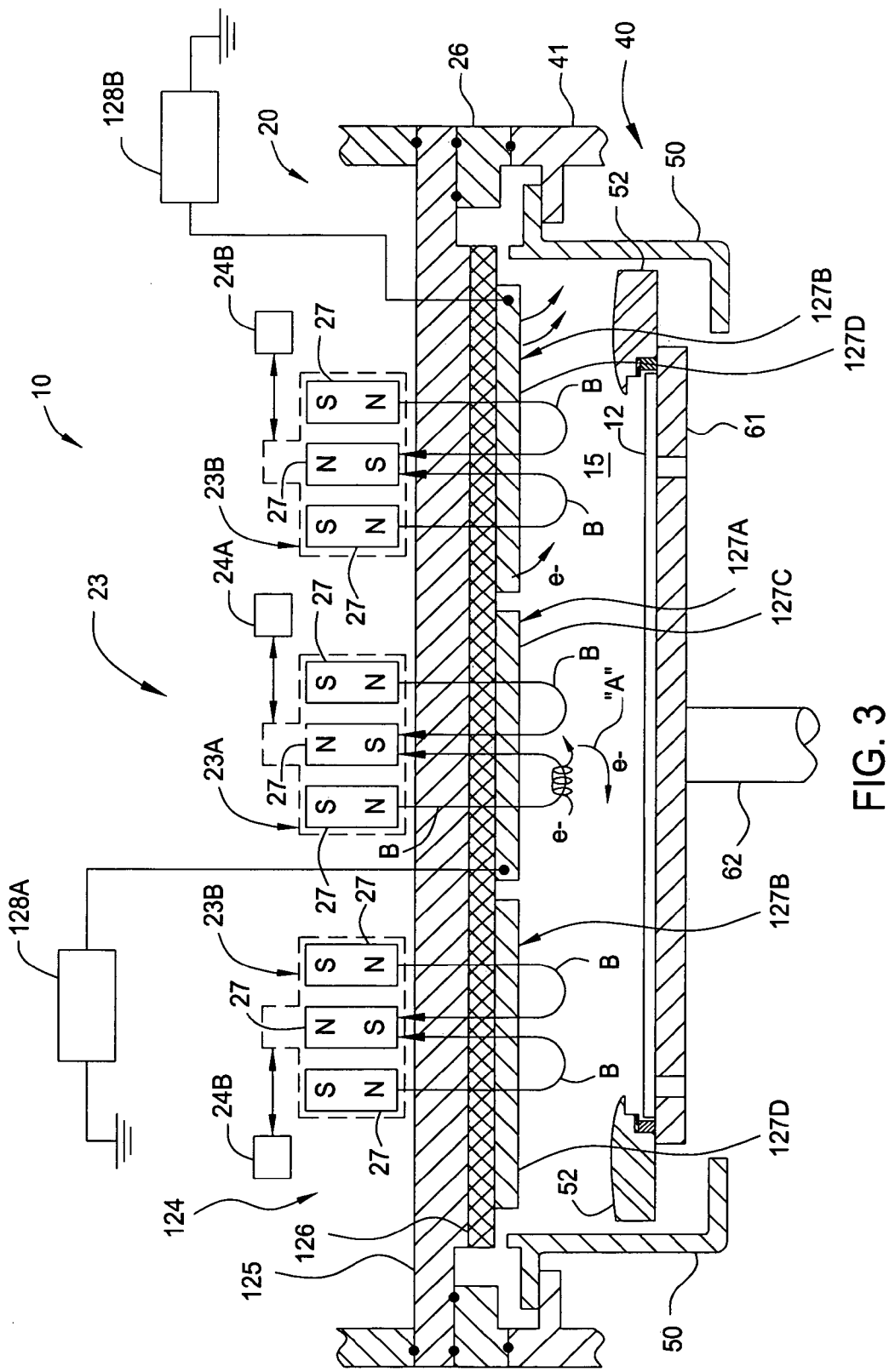
FIG. 3 is a vertical cross-sectional view of a processing region formed in an exemplary physical vapor deposition chamber.

FIG. 3 illustrates a close up view of the processing region 15 and lid assembly 20 of one embodiment of the process chamber 10. The embodiment illustrated in FIG. 3 has a lid assembly 20 that has a multizone target assembly 124 and at least one magnetron assembly 23 positioned adjacent to each of the target sections of the multizone target assembly 124. Typically, to improve utilization of the target material and improve deposition uniformity it is common to translate (e.g., raster; scan, and/or rotate) each of the magnetron assemblies in at least one of the directions that are parallel to the target surface 127C-D by use of one or more magnetron actuators 24A and 24B. The magnetron actuator(s) may be a linear motor, stepper motor, or DC servo motor that are adapted to position and move the magnetron assembly in a desired direction at a desired speed by use of commands from the controller 101. A translation mechanism used to move the magnetron, along with magnet orientations in the magnetron assembly, that may be adapted to benefit the invention described herein is further described in the commonly assigned U.S. patent application Ser. No. 10/863,152, filed Jun. 7, 2004, which claims the benefit of U.S. Provisional Patent Application Ser. No. 60/534,952, filed Jan. 7, 2004, and is hereby incorporated by reference in its entirety to the extent not inconsistent with the claimed invention.

During the PVD deposition process a large portion of the generated plasma in the processing region 15 is formed and is retained below the magnetron assemblies 23 due to the magnetic fields (elements "B") containment of the electrons found in the processing region 15. The optimum magnetic field profile for a processing chamber 10 will vary from one substrate size to another, from the ratio of the anode (e.g., grounded surface) to cathode (e.g., target) surface area, target to substrate spacing, PVD process pressure, motion of the magnetron across the target face, desired deposition rate, and type of material that is being deposited. The effectiveness of the magnetron 23 on reducing the center to edge deposited thickness variation is affected by the magnetic permeability of the target material(s). Therefore, in some case the magnetron magnetic field pattern may need to be adjusted based on the type of multizone target assembly 124 material(s) and their thickness(es).

The magnetron assembly 23 has an effect on the shape and uniformity of the PVD deposited layer due to the strength and orientation of the magnetic fields generated by the magnetron assembly 23. In general, each of the magnetron assemblies 23 (elements 23A-B) will contain at least one magnet 27. The magnets 27 may be permanent magnets (e.g., neodymium, samarium-cobalt, ceramic, or Alnico) or electromagnets.

Referring to FIG. 3, in one embodiment of the processing chamber 10, the one or more magnetron assemblies 23 are distributed across the multizone target assembly 124 to balance out the difference in current flow between the center and edge of the target caused by the differing resistance to the anode (e.g., ground) for each of these paths. The control of the magnetic field distribution from the center to the edge of the multizone target assembly 124 is used to control and improve plasma density and thus the deposition uniformity across the processing surface, which is positioned near the surface of the target sections (elements 127C-D). In one aspect, the magnetic field strength of the magnetron assemblies 23 is configured to deliver a higher magnetic field strength in the target sections (e.g., element 127A FIG. 4A) near the center rather than at the edge of the multizone target.

In one aspect, each of the magnetron assemblies 23A or 23B are adapted to translate across the target section(s) in unison by use of magnetron actuator(s) (elements 24A-B in FIG. 3) to control plasma density uniformity and improve the deposition profile across the substrate surface. In another aspect, each of the magnetron assemblies 23A or 23B are adapted to be separately translated across the target sections by use of one or more magnetron actuators (element 24A-B FIG. 4A). In one aspect, it may be desirable to limit the translation of the magnetron assemblies to positions that minimize the interaction with the other target sections and magnetron assemblies 23 to improve the deposition uniformity profile across the substrate.

Insulative Bonding

Figure 4:
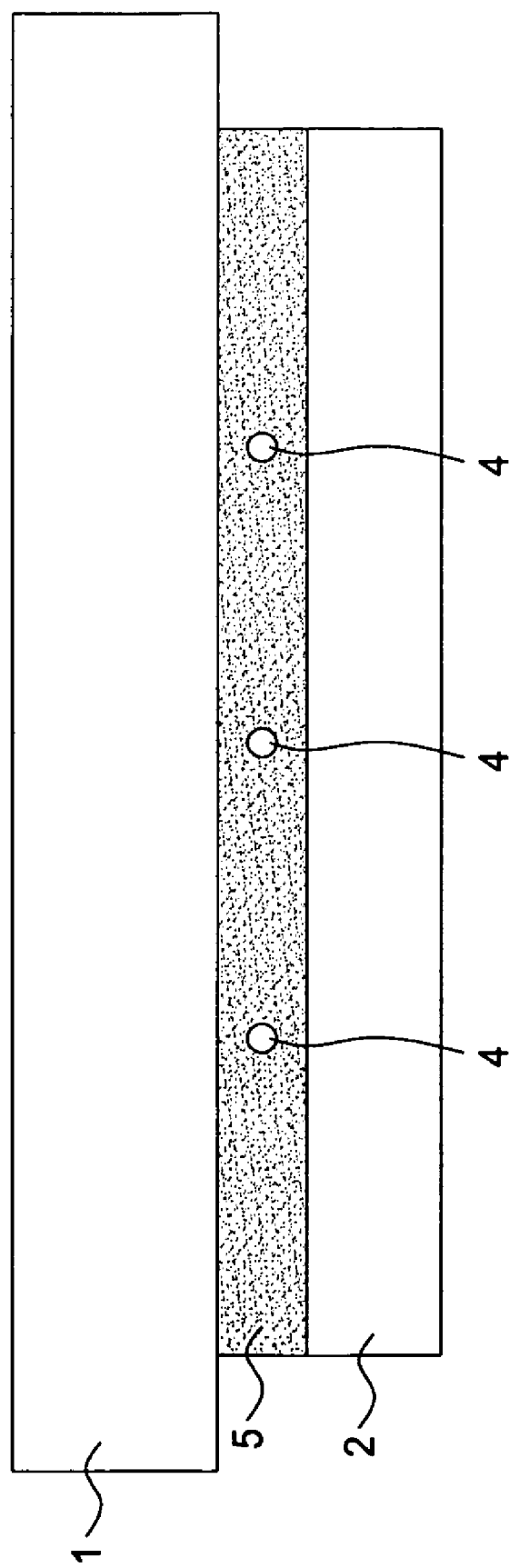
FIG. 4 is a sputtering target assembly using diamond particles.

FIG. 4 shows an exemplary embodiment of the present invention. FIG. 4 shows a backing plate 1, bonded to a sputtering target 2 using a bonding material 5 that comprises diamond or a ceramic or combinations thereof and a dielectric screen. The screen is used as a spacer between the target and the backing plate. The screen could be a dielectric screen or glass beads. Exemplary dielectric screens include nylon screens and glass fiber screens. Dielectric dots such as polyimide dots or thin glass dots with flat or hemisphere shape could also be used. The screen preferably has a circular shaped cross section. So long as the screen can provide reliable spacing between the target and the backing plate without negatively affecting the adhesion, the screen size can be fairly large. Ideally, the bonding material is no more than 1 mm thick. The target is bonded to the backing plate by pressing the target, the backing plate, and the bonding material together to thermally cure at temperature between 30° C. and 200° C.

Fine diamond powders are used as filler in the elastomer that forms a dielectric bond. Diamond, while expensive in jewelry, is relatively cheap in small particle sizes. Preferably, the size of the diamond power should be sized so that the highest thermal conductivity can be achieved while using the lowest content of diamond possible. By using as little diamond as possible, costs can remain low. Also, the more diamond that is used, the less elastomer that is used. An exemplary weight or volume ratio of elastomer to diamond particles is 1:1. Sufficient elastomer is necessary to form a strong bond between the target and the backing plate. Diamond sizes of below 1 micron are preferred. Particularly preferable diamond sizes include about 10 nm to about 500 nm. The diamond particles should be uniform with a monodisperse size distribution with a standard distribution of less than 50%. Preferably, the standard distribution is less than 10%.

Diamond has a very good thermal conductivity. The thermal conductivity of diamond is about 6 times greater than that of silver. Even better, the electrical resistivity of diamond is about 19 orders of magnitude higher than silver. Diamond also compares favorably to glass with regards to the dielectric strength. Diamond also has a relatively low loss tangent so that it can be used for bonding targets powered by high frequency RF power. The table below shows a comparison of physical properties of silver, glass, and diamond at room temperature.

TABLE

| Property | Silver | Glass (SiO2) | Diamond |
|---|---|---|---|
| Thermal conductivity (W/cmK) | 4.29 | 0.01 | 20 |
| Electrical resistivity (ohm-cm) | $1.6 \times 10^{-6}$ | $4 \times 10^{9}$-$3 \times 10^{10}$ | $1 \times 10^{13}$-$1 \times 10^{16}$ |
| Thermal expansion coefficient (1/K) | $18 \times 10^{-6}$ | $5 \times 10^{-6}$-$9 \times 10^{-6}$ | $1.1 \times 10^{-6}$ |
| Dielectric constant | | 3.8 | 5.7 |
| Dielectric strength (V/cm) | | >10,000,000 | 10,000,000 |
| Loss tangent at 106 Hz | | <0.0003 | <0.0002 |

Instead of diamond, other particle fillers can also be used. Some of the materials include ceramics or other composed materials. Exemplary materials include aluminum nitride, aluminum oxide, beryllium oxide, boron nitride, silicon carbide, cerium oxide, tin oxide, magnesium oxide, stannic oxide, zinc oxide, cupric oxide, or yttria. Ideally, the thermal conductivity should be greater than 0.1 W/cmK. For the instant invention, silver should not be used.

Target Sections

Figure 5:
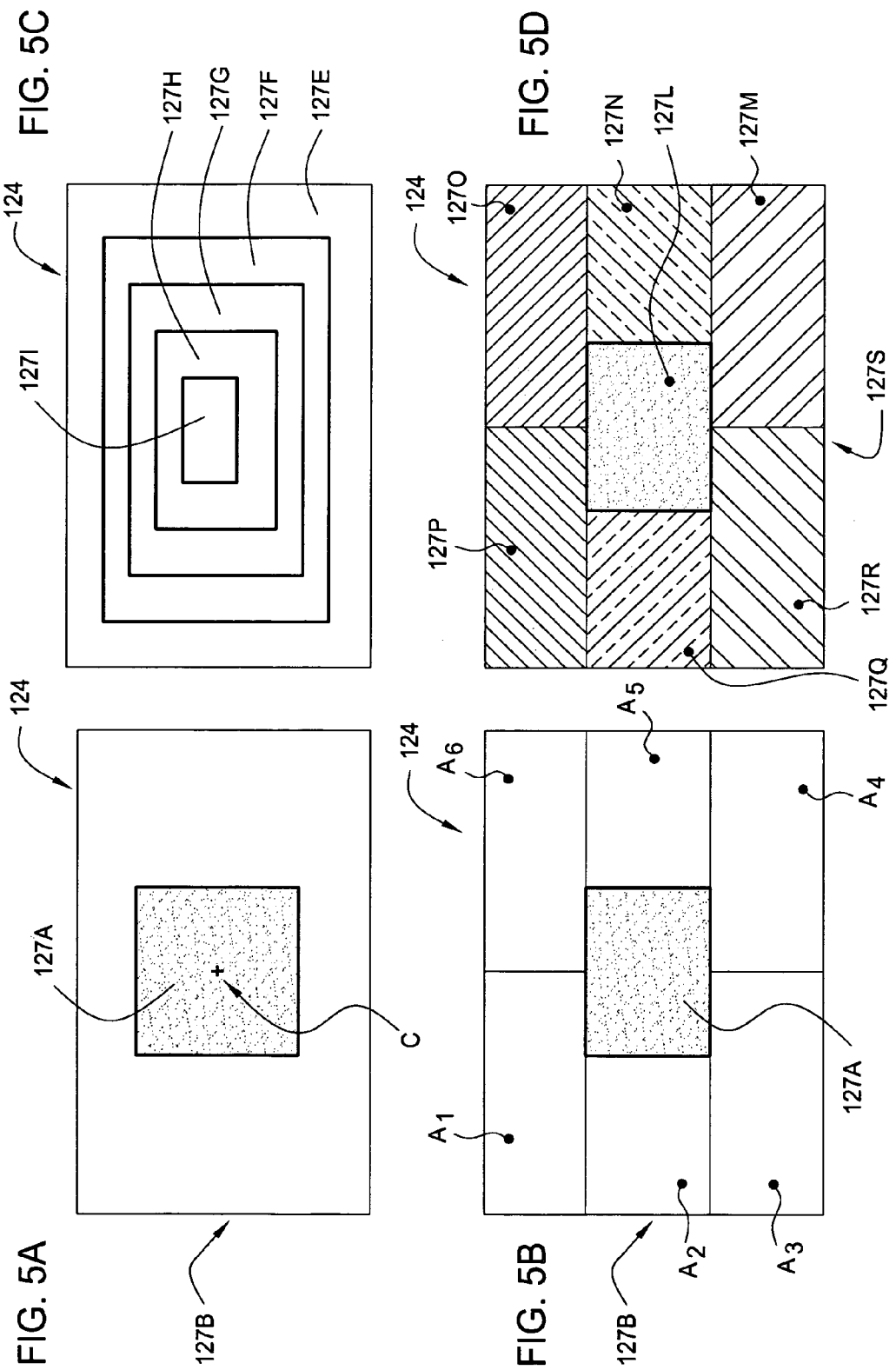
FIG. 5A illustrates a plan view of one embodiment of the multizone target assembly illustrated in FIG. 2 that contains two target sections.
FIG. 5B illustrates a plan view of one embodiment of the multizone target assembly illustrated in FIG. 2 that contains two target sections that are formed from multiple tiles.
FIG. 5C illustrates a plan view of one embodiment of the multizone target assembly that contains five concentric target sections.
FIG. 5D illustrates a plan view of one embodiment of the multizone target assembly that contains seven target sections.

FIG. 5A illustrates a plan view of one embodiment of the multizone target assembly 124 illustrated in FIG. 2 that contains two target sections 127A and 127B. In this configuration, each of the target sections 127A-B are formed from a single continuous piece of target material that will be sputter deposited onto the substrate surface. In one aspect, each of the target sections are formed from the same type of material so that the deposited film will have a uniform thickness and composition across the substrate surface. In one embodiment, as shown in FIG. 5A, a first target region 127A is "surrounded" by a second target region 127B. The term "surrounded" as used herein is intended to describe a positional orientation in at least one plane where a first target region is positioned within or encircled by a second target region. In another embodiment of the multizone target assembly 124, the target regions are "surrounded" and at least one axis of symmetry of a first target region 127A is coincident to an axis of symmetry of a second target region 127B. For example, the center point (element "C") of each of the target sections (elements 127A and 127B) are coincident with each other. One will note that the shape and size of the target surfaces 127C-D (FIG. 3) of the target sections 127A-B, as illustrated in FIGS. 5A-D, is dependent on the size and dimensions of the substrate. In general, the total surface area of the target surfaces (e.g., 127C-D) will be larger than the surface area of the substrate to avoid deposition non-uniformities created by plasma non-uniformities at the edge of the multizone target assembly 124. In one aspect, when the multizone target assembly 124 is used to deposit a layer on a rectangular flat panel display substrate, or rectangular solar cell type substrate, the target sections form an active target surface that extends at least a few centimeters past the edge of the substrate in each direction.

FIG. 5B illustrates a plan view of one embodiment of the multizone target assembly 124 illustrated in FIG. 2 that contains two target sections 127A and 127B. In the configuration shown in FIG. 5B, the outer target section 127B is formed from multiple "plates" (elements $A_1$-$A_6$), or "tiles," that are generally made of the same target material. As flat panel display substrates are becoming larger (e.g., >19,500 cm²) it becomes cost prohibitive and in some cases technically impossible to form a target from a single monolithic plate. Therefore, targets formed from multiple plates that are electrically connected to each other, by welding, conductive bonding to a conductive backing plate or electrical connections formed by use of discrete wires, may be used to form each target section. In one aspect, the multiple plates are welded together by use of an e-beam welding process, a laser welding process, arc welding process or other comparable process that can be used to join materials together. Examples of exemplary techniques and physical shapes that may be used to form various target sections are further described in the U.S. patent application Ser. No. 10/888,383, filed Jul. 9, 2004 and U.S. patent application Ser. No. 11/158,270, filed Jun. 21, 2005, which are incorporated by reference herein in their entirety to the extent not inconsistent with the claimed aspects and description herein. Although, FIG. 5B illustrates one embodiment in which the outer target section 127B is formed from multiple plates and the inner target is formed from a single plate, other embodiments of the invention may have more than one target section (e.g., element 127A), or even all target sections, formed from a plurality of electrically connected plates.

FIG. 5C illustrates a plan view of one embodiment of the multizone target assembly 124 that contains five concentric target sections 127E-I. In this configuration each target section can be separately biased at different potentials by use of a power supplies (not shown) attached to each target section. In one embodiment, one or more of the target sections may be grounded while other target sections are biased. For example, target sections 127E, 127G and 127I may each be biased at some desired voltage, while target sections 127F and 127H may be grounded.

FIG. 5D illustrates a plan view of one embodiment of the multizone target assembly 124 that contains seven target sections 127L-S. In this configuration each target section can be separately biased at a different potential by use of a power supply (not shown) attached to each target section to improve the sputter deposition uniformity:

It should be noted that while FIGS. 2 and 3 generally illustrate a multizone target assembly 124 that has target sections that are in the same plane (e.g., horizontal plane) this configuration is not intended to be limiting as to the scope of the invention described herein. In one embodiment, the target section(s) near the center of the multizone target assembly are positioned a further distance from the surface of the substrate than the target section(s) near the edge of the multizone target assembly. In another embodiment, the target section(s) near the center of the multizone target-assembly are positioned closer to the surface of the substrate than the target section(s) near the edge of the multizone target assembly. Also, it should be noted that while FIGS. 2 and 3 generally illustrate a multizone target assembly 124 that has target sections that have a surface (e.g., 127C and 127D) that is generally parallel to the substrate surface in contact with the processing region 15, other embodiments may orient at least part of one or more of the target sections such that they are not parallel to the substrate surface. Examples of shapes of the multizone target assembly surfaces (e.g., 127C and 127D) may include, for example, a convex or concave shape.

Multizone Target Assembly Hardware

Figure 6:
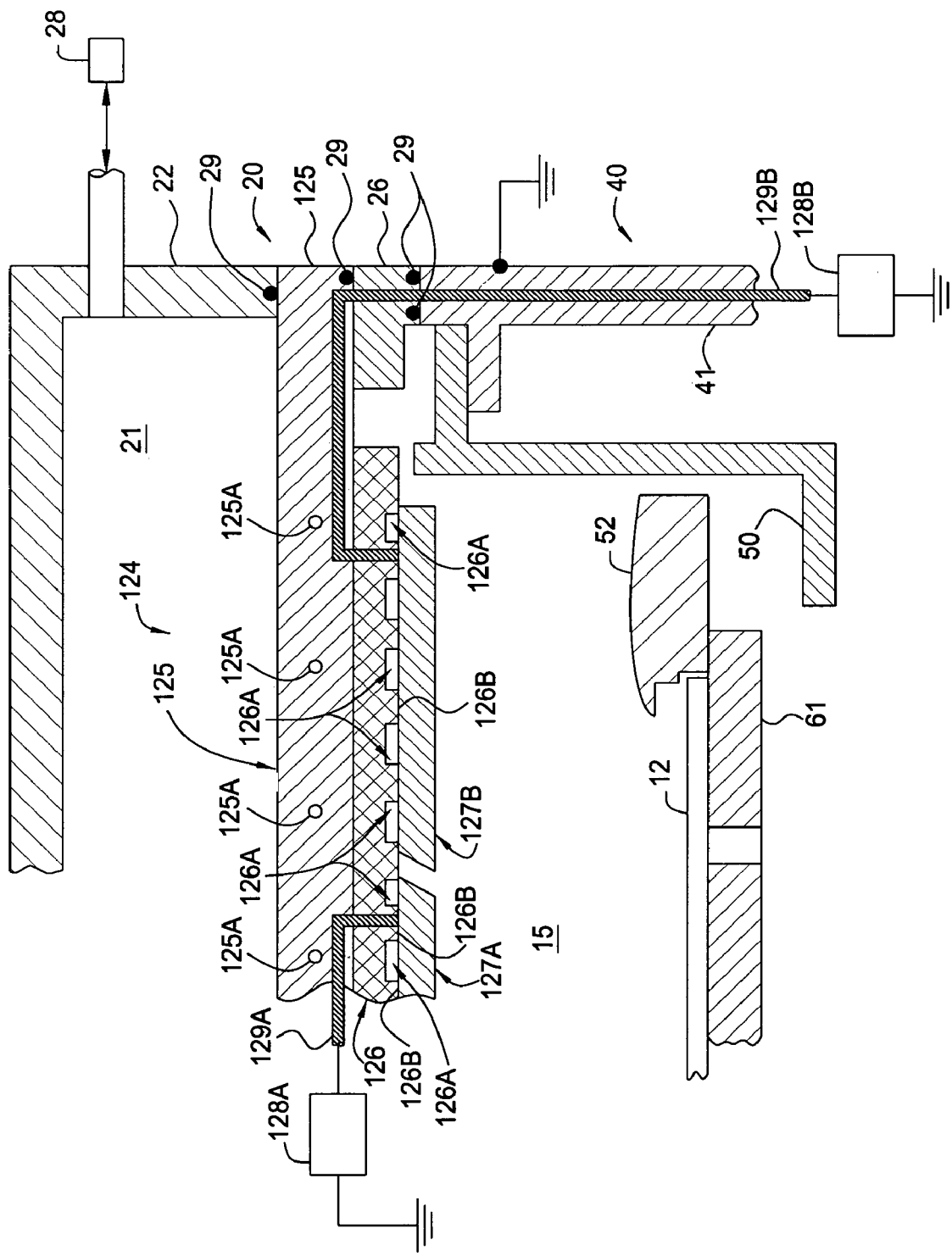
FIG. 6 is a vertical cross-sectional view of a processing region formed in an exemplary physical vapor deposition chamber.

FIG. 6 illustrates an enlarged vertical cross-sectional view of one embodiment of the lid assembly 20 shown in FIG. 2. One will note that some of the elements shown in FIG. 6 are not shown in FIG. 2 for clarity reasons. The lid assembly 20, as shown in FIG. 6, generally contains a multizone target assembly 124, a lid enclosure 22, a ceramic insulator 26, one or more o-ring seals 29 and one or more magnetron assemblies 23 (FIG. 2). The multizone target assembly 124 contains a backing plate 125, an insulator 126, and two or more target sections (e.g., elements 127A and 127B) that have a corresponding electrical connection (elements 129A and 129B) that connects each target section to its power supply (elements 128A-B) so that it can be biased during processing. In one aspect, the multizone target assembly 124 is electrically isolated from the electrically grounded chamber walls 41 of the chamber body assembly 40 by use of an insulator 26. This configuration may be useful to prevent or minimize arcing between the biased target sections and the backing plate 125 during processing. In another aspect, the insulator 126 is removed to allow the backing plate 125 to be in electrical communication with the chamber body assembly 40 components.

In one aspect, the target sections are electrically isolated from each other and supported by the insulator 126. In one aspect, the insulator 126 is made of an electrically insulative material, such as a ceramic material (e.g., aluminum oxide ($Al_2O_3$), aluminum nitride (AlN), quartz ($SiO_2$), Zirconia (ZrO)), a polymeric material (e.g., polyimide (Vespel®)) or other suitable material that may be able to structurally withstand the temperatures seen by the multizone target assembly 124 during processing. The thickness of the insulator 126 is sized to provide electrical isolation between the target sections and between the target sections and the backing plate 125. In one aspect, the target sections are brazed or bonded by conventional means to the insulator 126 at a bonded region 126B. In another aspect, the target sections are mechanically fastened (e.g., bolts) to the insulator 126 by conventional means.

In one aspect, the target sections are actively cooled by use of heat exchanging channels 125A formed in the backing plate 125 to prevent the target sections or braze or bonding materials used to form the bonded region 126B from being damaged by the temperatures achieved by the multizone target assembly 124 during processing. In this configuration the backing plate 125 is in thermal contact with the target sections through the insulator 126, which is attached to the backing plate 125. In one aspect, the insulator 126 is brazed, bonded or mechanically fastened to the backing plate 125 by conventional means to improve the thermal heat transfer between the insulator 126 and the backing plate 125. The heat exchanging channels 125A are in fluid communication with a primary heat exchanging device (not shown) that is adapted to deliver a heat exchanging fluid (e.g., DI water, perfluoropolyethers (e.g., Galden®)) at a desired temperature and flow rate through them. The backing plate 125 may be made from an aluminum alloy, stainless steel alloy, or other thermally conductive material, and is designed to structurally support the other components in the multizone target assembly 124.

In another aspect, the target sections and bonded region(s) 126B are cooled by use of a plurality of cooling channels 126A formed in the insulator 126, or target sections. In one aspect, a heat exchanging fluid is delivered through the cooling channels 126A to transfer the heat generated during processing away from the target sections. In one aspect, the heat exchanging fluid is delivered from a conventional heat exchanging fluid source (not shown) that is adapted to deliver the heat exchanging fluid at a desired temperature. In one aspect, the conventional heat exchanging fluid source is adapted to control the temperature of the heat exchanging fluid delivered to the cooling channels 126A by use of a conventional refrigeration unit, resistive heater, and/or thermoelectric device. The heat exchanging fluid may be, for example, a gas (e.g., helium, nitrogen, or argon) or a liquid (e.g., DI water). In one aspect, the heat exchanging fluid is a gas, such as helium (He), that is delivered to the cooling channels 126A and maintained at a pressure between 500 milliTorr to about 50 Torr to transfer heat from the target sections to the insulator 126 and backing plate 125. In another aspect, a flow of helium is delivered to the cooling channels 126A to transfer heat from the target sections to the insulator 126 and backing plate 125. The cooling channels 126A may be useful to prevent the material in the bonded regions 126B, for example, indium braze materials or polymeric materials from overheating, which can cause the adhesive properties of the bonded region 126B to fail. The cooling channels 126A may be about 0.001 inches to about 1 inch in height (e.g., distance from the target section), while the width of the cooling channels 126A may be optimized to assure adequate bonding area of the bonded regions 126B formed between the insulator 126 and the target sections versus adequate cooling capacity.

Referring to FIGS. 2 and 6, in one embodiment of the process chamber 10, a vacuum pump 28 is used to evacuate the target backside region 21 to reduce the stress induced in the multizone target assembly 124 due to the pressure differential created between the processing region 15 and the target backside region 21. The reduction in the pressure differential across the multizone target assembly 124 can be important for process chambers 10 that are adapted to process large area substrates greater than 2000 cm² to prevent the large deflections of the center of the multizone target assembly 124. Large deflections are often experienced even when the pressure differential is about equal to atmospheric pressure (e.g., 14 psi).

Figure 7A:
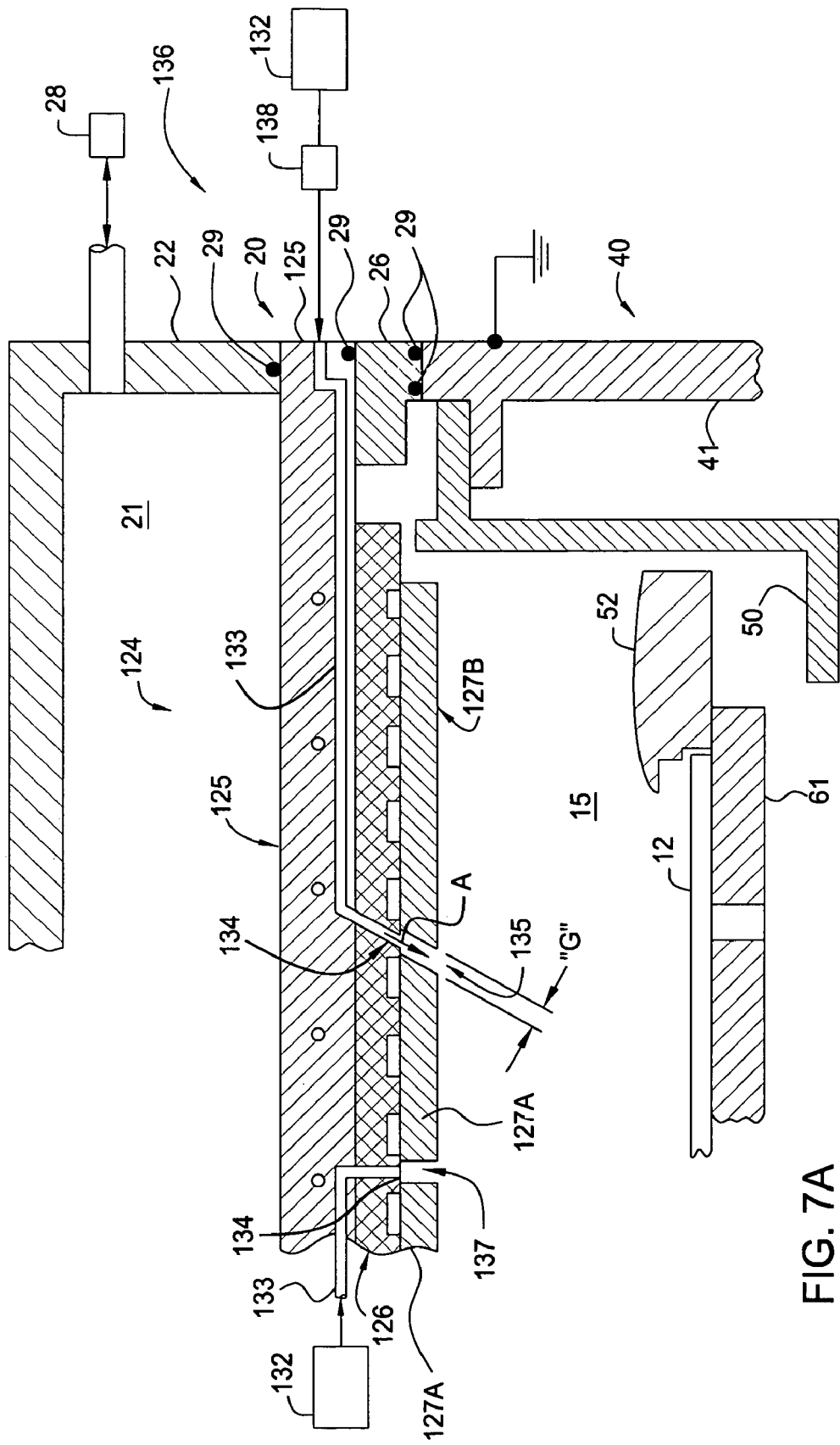
FIG. 7A is a vertical cross-sectional view of a processing region formed in an exemplary physical vapor deposition chamber.

Referring to FIGS. 2 and 7A, in one aspect of the multizone target assembly 124, a gap "G" is formed between the target sections to electrically isolate the target sections. The gap "G" may be between about 0.05 and about 100 millimeters (mm). In one aspect, the gap "G" is sized to be smaller than the dark space thickness so that a plasma will not be formed in the gap "G." Selecting a desirable gap "G" dimension will help to prevent plasma attack of the bonded regions 126B (FIG. 6). Selection of a gap "G" smaller than the dark space thickness will also help to remove a source of particles due to re-deposition of the sputtered material on the target surface and also prevent the plasma generated deposition from creating arcing path between target sections. One will note that the dark space thickness is dependent on the gas pressure in the processing region 15, where generally the higher the pressure the smaller the dark space thickness.

FIG. 7A is vertical cross-sectional view of one embodiment of the multizone target assembly 124 that has a process gas delivery assembly 136 that contains at least one gas source 132, at least one gas channel 133 and at least one exit port 134 that are adapted to deliver a processing gas (element "A") to the. processing region 15. In one embodiment of the process gas delivery assembly 136, at least two or more of the exit ports 134 are connected to separate gas channels. 133 and gas sources 132 to deliver different concentrations or flow rates of a desired processing gas to the processing region 15. The processing gasses may include inert gases, such as argon (Ar) or helium (He), and/or reactive gases that may be used for reactive sputtering processes, such as nitrogen ($N_2$), hydrogen ($H_2$) or oxygen ($O_2$). Since the density of the generated plasma during processing is related to the localized pressure in the processing region 15, the gas flow and gas flow distribution into the processing region 15 can be controlled. In one aspect, a plurality of exit ports 134 spaced across the multizone target assembly 124 are used to deliver a desired gas distribution to the processing region 15. In one aspect, a flow restrictor 138 is added in at least one of the gas channels 133 to control and balance the flow of the process gas through the plurality of exit ports 134.

In one aspect of the process gas delivery assembly 136, as shown in FIG. 7A, at least one gas channel 133 and at least one exit port 134 are adapted to deliver a processing gas to the processing region.15 through a space 135 formed between the target sections (e.g., elements 127A and 127B). In one aspect, a plurality of exit ports 134 are uniformly spaced along the length of the gap "G" formed between at least two of the target sections to deliver a uniform gas flow into the processing region 15. FIG. 7B illustrates a plan view of one embodiment of the multizone target assembly 124 that contains three target sections 127A, 127B and 127C that have a plurality of exit ports 134 formed in the gaps "G" between the target sections (i.e., between 127A and 127B, and between 127B and 127C).

In another aspect of the process gas delivery assembly 136, one or more of the exit ports 134 are formed through the middle of at least one of the target sections (e.g., element 137 formed in 127A). FIG. 7C illustrates a plan view of one embodiment of the multizone target assembly 124 that contains two target sections 127A and 127B, and one target section (element 127A) has an exit port 134 that is adapted to deliver a process gas through the center (element "C") of the target section by use of a gas source (not shown). FIG. 7D illustrates a plan view of one embodiment of the multizone target assembly 124 that has plurality of exit ports that are adapted to deliver a process gas to the processing region 15 through the target sections 127A (element 134A) and through the target sections 127B (element 134B) by use of one or more gas sources (not shown) connected to the exit ports (elements 134A and 134B).

In one aspect, as shown in FIG. 7A, the process gas delivery assembly 136 has at least two exit ports, where at least one exit port 134 is adapted to deliver gas through a region formed (element 137) in the middle of a target section and at least one exit port 134 is adapted to deliver the process gas through the gap "G" formed between at least two of the target sections. The various embodiments illustrated in FIGS. 7A-D may be especially effective for use in a reactive sputtering process (e.g., TaN, TiN) since the process uniformity is related to uniformity of the reactive gas delivered to the processing region 15. In this configuration it may be desirable to deliver reactive gases from a gas source 132 to the processing region 15 through a plurality of exit ports 134 that are evenly distributed across the multizone target assembly 124.

In one aspect, it is desirable to shape the edges of the target sections so that they overlap, as shown in FIGS. 6 and 7A, to in a sense hide the insulator 126 and bonded region 126B from the plasma formed in the processing region 15. Referring to FIG. 7A, in one embodiment it may be useful to bevel the edges of the target sections near the region between them to form an overlapping feature which "hides" the bonded region 126B. In one aspect, it may be desirable to remove all sharp edges of the target sections to reduce the current density emitted from these areas and thus make the electron emission and plasma generation more uniform in the processing region 15.

Figure 1:
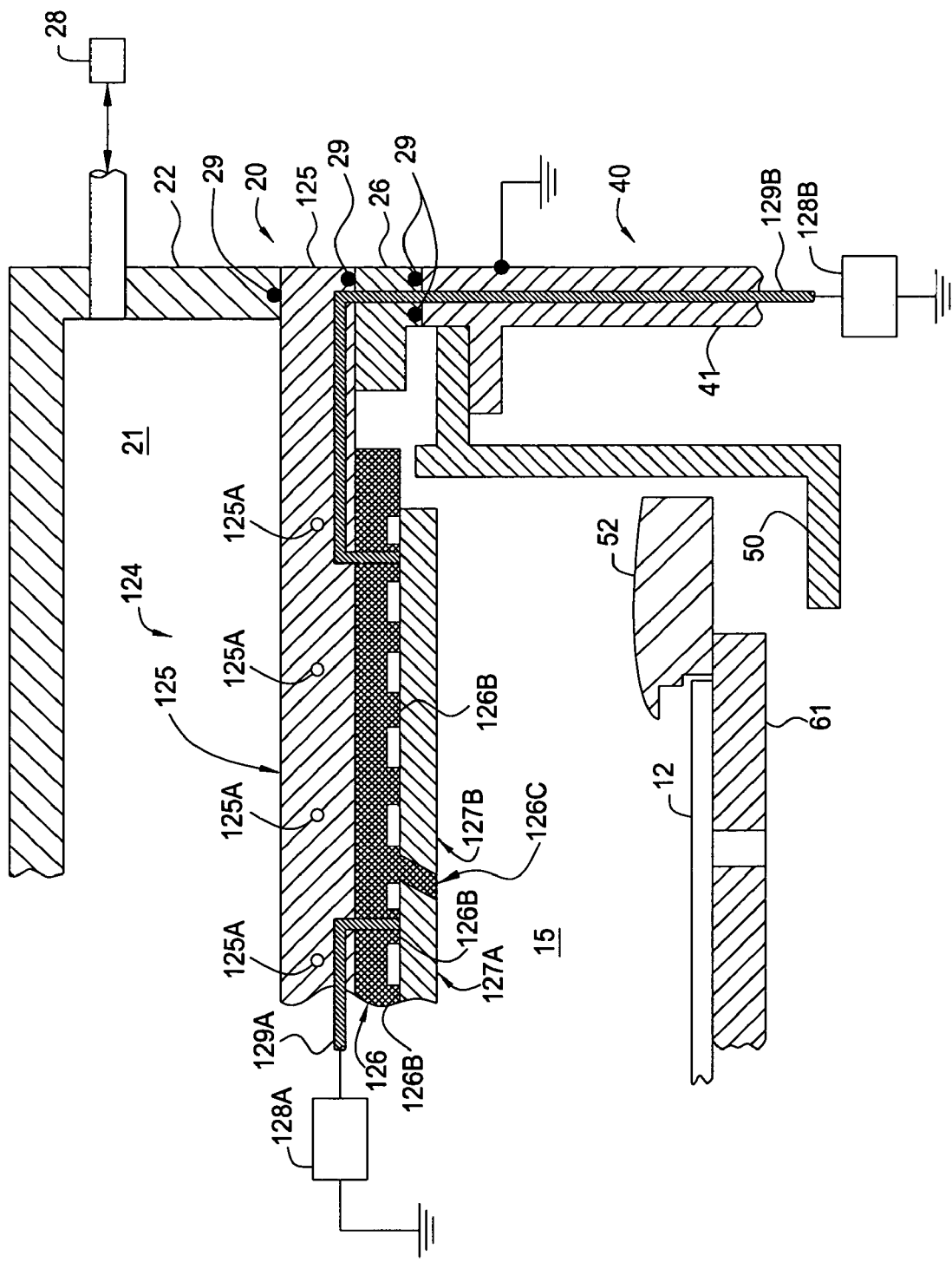
FIG. 1 is a vertical cross-sectional view of a processing region formed in an exemplary physical vapor deposition chamber.

FIG. 1 illustrates one embodiment in which the target sections are positioned in one or more recesses in the insulator 126. In this configuration the insulator protrusions 126C formed in the insulator 126 are used to fill the gap(s) between the target regions. The use of the insulator protrusions 126C can help to prevent the generation of a plasma between the target regions and electrically isolate the target regions. In one aspect, it may be desirable to add features (e.g., high aspect ratio trenches, recesses, overhangs) to the insulator protrusions 126C to prevent any re-deposited target material from forming an arcing path between the target regions.

While the foregoing is directed to embodiments of the present invention, other and further embodiments of the invention may be devised without departing from the basic scope thereof, and the scope thereof is determined by the claims that follow.

The invention claimed is:

1. A sputtering target assembly consisting essentially of:
 a plurality of sputtering targets electrically isolated from one another;
 a backing plate; and
 a diamond material bonding said plurality of sputtering targets to said backing plate and electrically insulating said plurality of sputtering targets from said backing plate.

2. The target assembly as claimed in claim 1, wherein said material further comprises an elastomer.

3. The target assembly as claimed in claim 1, wherein said material further comprises a dielectric screen or glass beads.

4. The target assembly as claimed in claim 3, wherein said dielectric screen is selected from the group consisting of nylon screen and glass fiber screen.

5. The target assembly as claimed in claim 1, wherein said diamond comprises diamond particles with a particle size below 1 micron.

6. The target assembly as claimed in claim 1, wherein said material additionally comprises aluminum nitride, aluminum, aluminum oxide, beryllium oxide, boron nitride, silicon carbide, cerium oxide, tin oxide, magnesium oxide, stannic oxide, zinc oxide, cupric oxide, or yttria.

7. The target assembly as claimed in claim 1, wherein said material bonding said plurality of sputtering targets to said backing plate has a thickness of about 1 mm.

8. A method of bonding a sputtering target assembly consisting essentially of plurality of sputtering targets, a backing plate and bonding material comprising:
   positioning the plurality of sputtering targets on the backing plate, the sputtering targets being positioned to provide electrical isolation therebetween;
   disposing the bonding material comprising diamond between the plurality of sputtering targets and the backing plate;
   pressing the plurality of sputtering targets, the backing plate, and the bonding material together; and
   thermally curing the bonding material.

9. The method as claimed in claim 8, wherein said material further comprises an elastomer.

10. The method as claimed in claim 8, wherein said material further comprises a dielectric screen or glass beads.

11. The method as claimed in claim 10, wherein said dielectric screen is selected from the group consisting of nylon screen and glass fiber screen.

12. The method as claimed in claim 8, wherein said diamond comprises diamond particles with a particle size below 1 micron.

13. The method as claimed in claim 8, wherein said material additionally comprises aluminum nitride, aluminum, aluminum oxide, beryllium oxide, boron nitride, silicon carbide, cerium oxide, tin oxide, magnesium oxide, stannic oxide, zinc oxide, cupric oxide, or yttria.

14. The method as claimed in claim 8, wherein said material bonding said plurality of sputtering targets to said backing plate has a thickness of about 1 mm.

15. A sputtering target assembly comprising:
   a sputtering target;
   a backing plate having at least one cooling channel formed therein; and
   material bonding said target to said backing plate, said material electrically insulating said target from said backing plate and comprising a ceramic material with a thermal conductivity of greater than 0.1 W/cmK and not comprising silver.

16. The target assembly as claimed in claim 15, said material further comprises an elastomer.

17. The target assembly as claimed in claim 15, wherein said material further comprises a dielectric screen or glass beads.

18. The target assembly as claimed in claim 17, wherein said dielectric screen is selected from the group consisting of nylon screen and glass fiber screen.

19. The target assembly as claimed in claim 15, wherein said material comprises aluminum nitride, aluminum, aluminum oxide, beryllium oxide, boron nitride, silicon carbide, cerium oxide, tin oxide, magnesium oxide, stannic oxide, zinc oxide, cupric oxide, or yttria.

20. The target assembly as claimed in claim 15, wherein said material bonding said target to said backing plate has a thickness of about 1 mm.

* * * * *

UNITED STATES PATENT AND TRADEMARK OFFICE
CERTIFICATE OF CORRECTION

PATENT NO. : 7,588,668 B2 Page 1 of 1
APPLICATION NO. : 11/368000
DATED : September 15, 2009
INVENTOR(S) : Ye et al.

It is certified that error appears in the above-identified patent and that said Letters Patent is hereby corrected as shown below:

Title page in the References Cited item (56):

Please insert the following:
--DE 2707144 8/1977--
--DE 19701575 7/1998--
--JP 53007586 1/1978--
--JP 01004481 1/1989--
--JP 01149964 6/1989--
--JP 0248876 2/1990--
--JP 03061367 3/1991--
--JP 05059542 3/1993--
--Sloan, Domestic Price List, July 1, 1981, 1-68 pp.--.

Signed and Sealed this

Third Day of November, 2009

David J. Kappos
*Director of the United States Patent and Trademark Office*